United States Patent
Yang et al.

(10) Patent No.: US 9,424,384 B2
(45) Date of Patent: Aug. 23, 2016

(54) METHOD OF DENSITY-CONTROLLED FLOORPLAN DESIGN FOR INTEGRATED CIRCUITS AND INTEGRATED CIRCUITS

(71) Applicant: TAIWAN SEMICONDUCTOR MANUFACTURING COMPANY, LTD., Hsinchu (TW)

(72) Inventors: Chung-Chieh Yang, Zhubei (TW);
Yung-Chow Peng, Hsinchu (TW);
Chung-Peng Hsieh, New Taipei (TW);
Wen-Shen Chou, Zhubei (TW);
Chih-Chiang Chang, Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 7 days.

(21) Appl. No.: 14/310,376

(22) Filed: Jun. 20, 2014

(65) Prior Publication Data

US 2015/0370946 A1   Dec. 24, 2015

(51) Int. Cl.
*H01L 21/02* (2006.01)
*G06F 17/50* (2006.01)
*H01L 23/64* (2006.01)
*H01L 23/66* (2006.01)

(52) U.S. Cl.
CPC .......... *G06F 17/5072* (2013.01); *H01L 23/642* (2013.01); *H01L 23/66* (2013.01); *H01L 2223/6666* (2013.01); *H01L 2924/0002* (2013.01)

(58) Field of Classification Search
CPC ... G06F 17/5072; H01L 23/642; H01L 23/66; H01L 23/40
See application file for complete search history.

(56) References Cited

U.S. PATENT DOCUMENTS

2009/0278222 A1* 11/2009 Chadwick ........... H01L 27/0207
                                                              257/499

* cited by examiner

*Primary Examiner* — Marc Armand
*Assistant Examiner* — Sarah Salerno
(74) *Attorney, Agent, or Firm* — Hauptman Ham, LLP

(57) ABSTRACT

A method of density-controlled floorplan design for integrated circuits having a plurality of blocks includes positioning decoupling capacitor (DCAP) cells at least partially around a pattern density sensitive block. The method also includes changing at least a portion of a pattern density insensitive block adjacent to the pattern density sensitive block according to at least one pattern density rule.

21 Claims, 12 Drawing Sheets

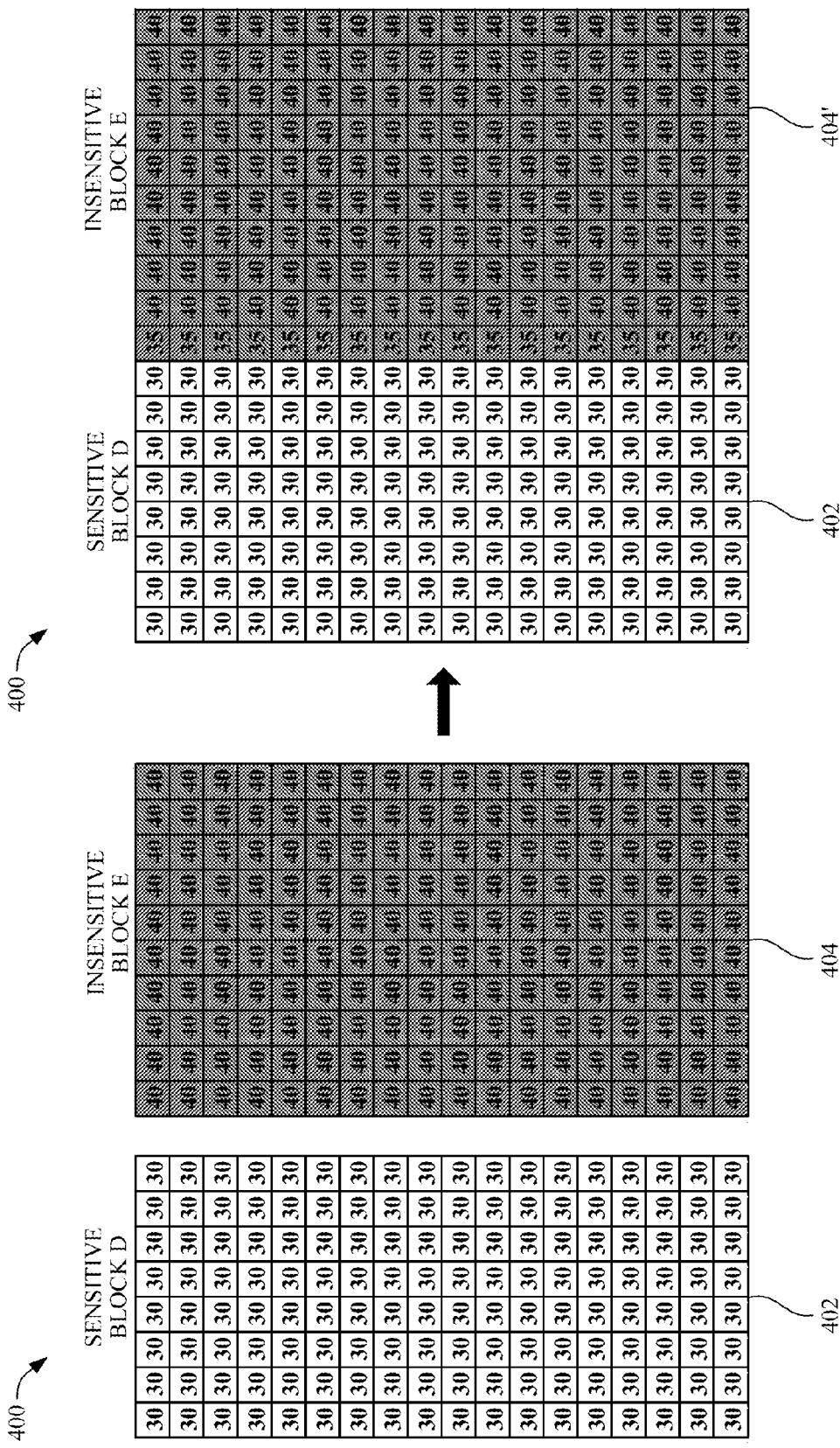

METHOD OF DENSITY-CONTROLLED FLOORPLAN DESIGN FOR INTEGRATED CIRCUITS AND INTEGRATED CIRCUITS

BACKGROUND

Integrated circuits (ICs) are often designed with a process design platform (PDP) having a product development kit (PDK) to produce a corresponding IC design file. The IC design file comprises one or more files and specifies configuration parameters describing an IC. One or more electronic design automation (EDA) tools receive the design file and create an IC manufacturing file to fabricate the IC, including fabricating arrays of similar electrical devices (blocks) and routing of conductive paths (also referred to as "nets") between nodes or terminals of those blocks that collectively form circuits. The IC manufacturing file also comprises one or more files and specifies the manufacturing parameters describing the IC, including a floorplan design describing a layout of the blocks. Increasingly dense ICs cause increasingly difficult design problems for EDA tools to overcome.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2E are diagrams of blocks at different stages in a density-controlled floorplan design for integrated circuits, in accordance with some embodiments.

FIGS. 4A-4D are diagrams of blocks with different pattern density rules at different stages in a density-controlled floorplan design for integrated circuits, in accordance with some embodiments.

DETAILED DESCRIPTION

Figure 1:
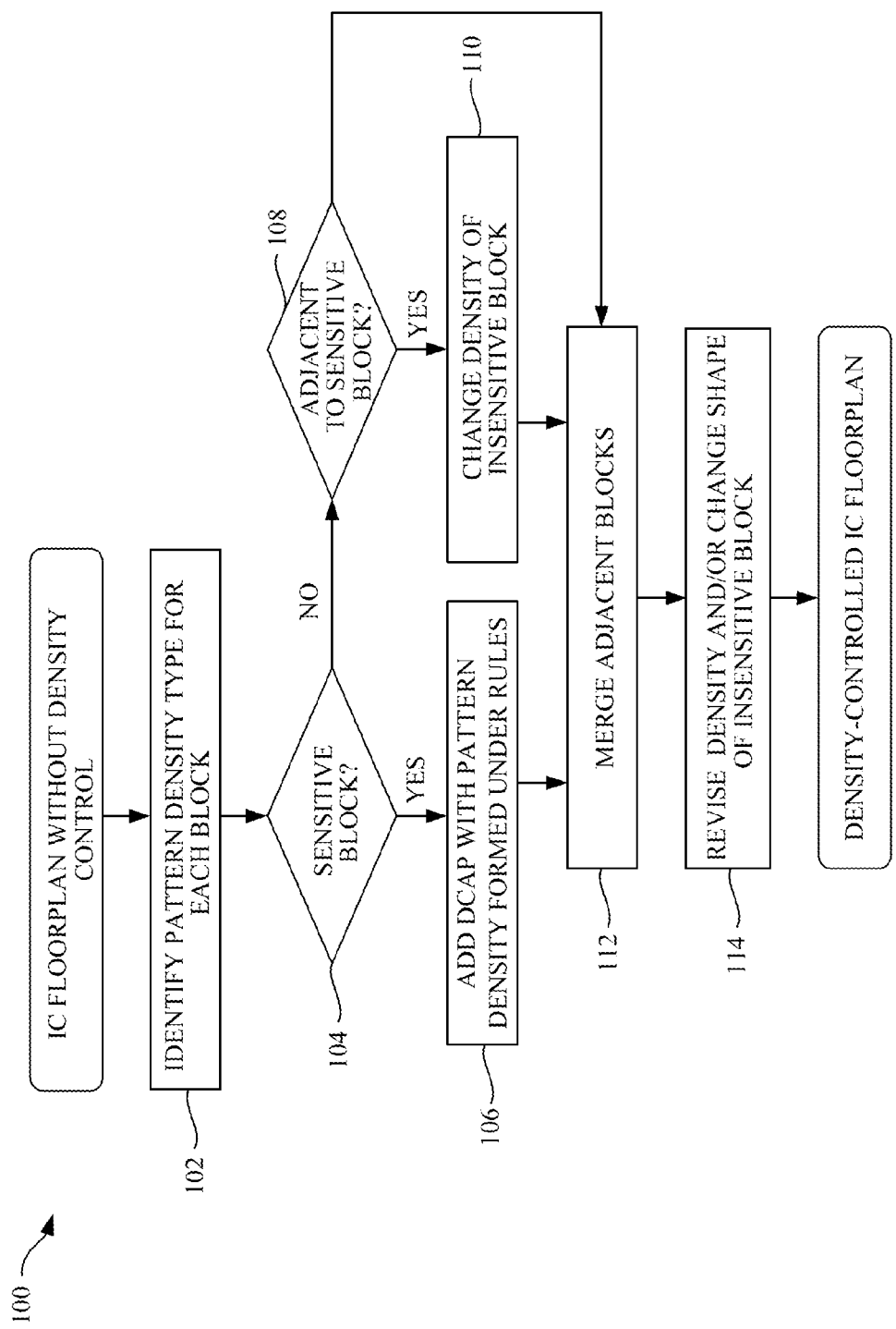
FIG. 1 is a flow chart of a method of density-controlled floorplan design for integrated circuits, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

EDA tools include layout creation and editing tools to design floorplans for ICs, design rule checker (DRC) tools to detect design rule violations according to specified IC design parameters and layout versus schematic (LVS) tools to identify and check IC electrical connectivity against IC schematics. A floorplan of an IC is a graphical representation of positional placement of the IC's functionally-related blocks of circuitry on a semiconductor die containing the IC. The floorplan defines a layout of functionally-related blocks of circuitry connected with nets between blocks to collectively form circuits.

Increasingly dense ICs cause increasingly difficult problems associated with floorplan design for EDA tools to overcome to enable those ICs to perform their intended functions. For example, as minimum IC feature size continues to decrease, deleterious effects that were previously unknown or essentially ignored in prior IC designs affect IC performance, including the deleterious effects caused by large, uncontrolled variations in pattern density of electrical devices such as metal oxide semiconductor field effect transistor (MOSFET) arrays, bi-polar junction (BJT) transistor arrays, resistor arrays, metal-oxide-metal capacitor arrays and decoupling capacitor (DCAP) arrays.

Pattern density is the area density of a specific layer in an IC layout. Examples of pattern density include: gate area density of a MOSFET array such as poly/oxide (PO) density, oxide definition (OD) area density, and area density of a particular metal layer. A block whose electrical performance is negatively affected by variations in pattern density under some circumstances, such that the block fails to meet a specified electrical performance metric, is designated a pattern density sensitive block. A block whose electrical performance is not negatively affected by variations in pattern density, such that the block meets specified electrical performance metrics, is designated a pattern density insensitive block. Some specified electrical performance metrics include limits on: breakdown voltage, cross-talk voltage, inductance, resistance, capacitance, impedance, current, current leakage, jitter, net gain, nonlinear distortion, slew rate, signal to noise ratio, total harmonic distortion and voltage drop. In some embodiments, a method of density-controlled floorplan design for integrated circuits controls pattern density by limiting pattern density around pattern density sensitive blocks according to pattern density rules including a minimum pattern density, a maximum pattern density, a maximum pattern density change per unit distance and/or a predetermined specific pattern density between two adjacent blocks. In some embodiments, pattern density around pattern density insensitive blocks, such as DCAP arrays, is not subject to the pattern density rules the pattern density around the pattern density sensitive blocks is subject to, and the pattern density insensitive block is reconfigured in terms of pattern density and shape. In some embodiments, DCAP cells are used to partially or completely surround pattern density sensitive blocks such that minimum pattern density, maximum pattern density and/or the maximum pattern density change per unit distance are maintained.

FIG. 1 is a flow chart of a method of density-controlled floorplan design for integrated circuits, in accordance with some embodiments. The method 100 is performed by a programmed processor executing a set of instructions. In operation 102, a type of pattern density is identified for each block containing cells of functionally-related circuitry for an IC floorplan without density control. In some embodiments, the more highly interconnected some blocks are and/or the more important speed through those interconnected blocks are, the more likely such blocks will be located near each other. In some embodiments, the type of pattern density identified is either pattern density sensitive or pattern density insensitive. As described in more detail below, pattern density rules are applied to cells in contact with, or nearby, a block that is identified as being pattern density sensitive. For example, one or more pattern density rules may be applied to change a pattern density of cells, in a block that is identified as being pattern density insensitive, that are closest to a pattern density sensitive block.

Figure 2A:
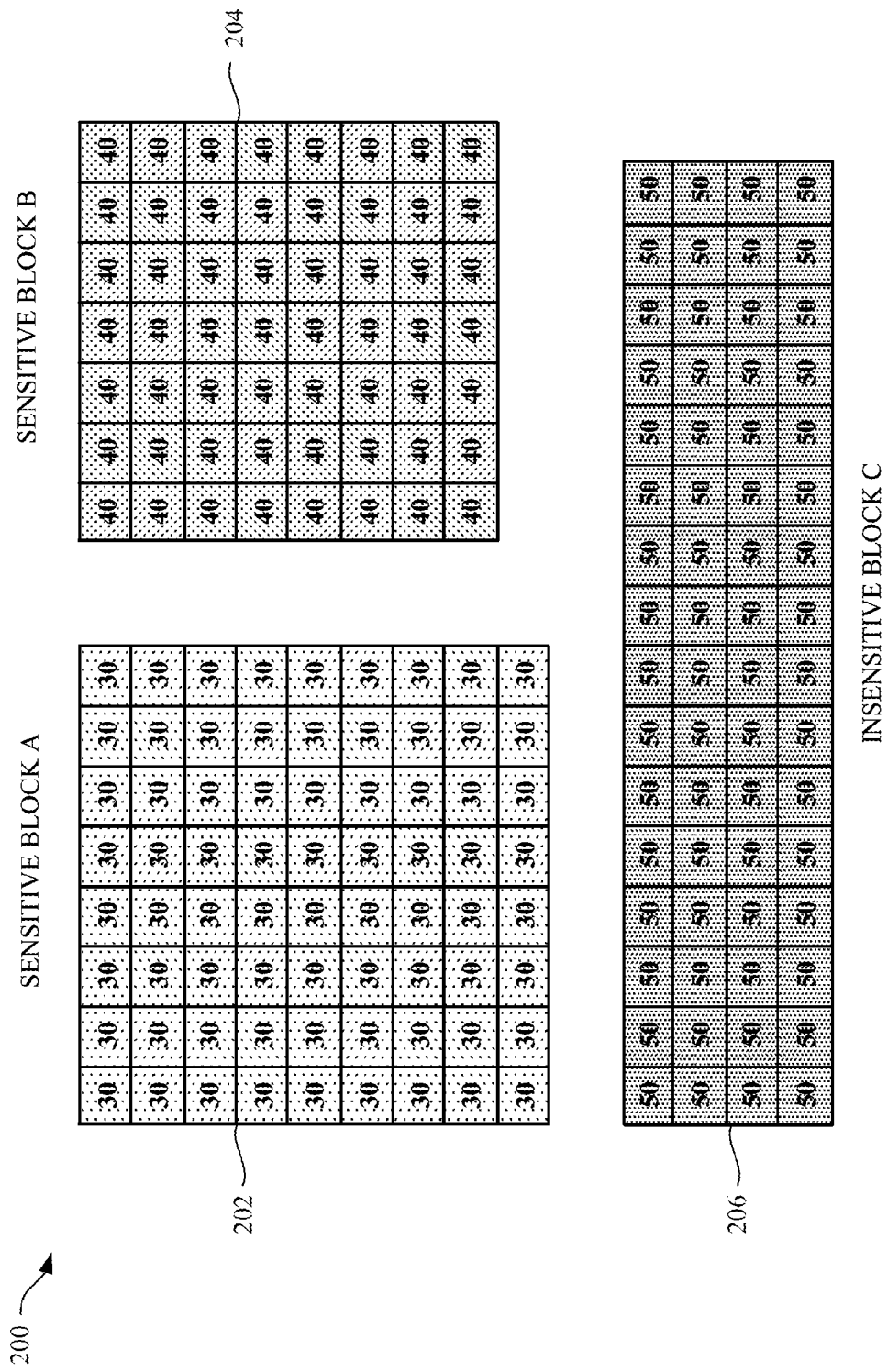

FIG. 2A is a diagram of blocks at one of different stages in a density-controlled floorplan design for integrated circuits 200, in accordance with some embodiments. Block A 202 is a pattern density sensitive block containing 72 cells arranged as an 8×9 cell array. The individual cells in block A 202 each have a pattern density of 30%. In some embodiments, a pattern density is the percentage of metallization in a particular metal layer. Block A 202 is adjacent to a block B 204, i.e., block A and block B have no other blocks between them. Block B 204 is a pattern density sensitive block containing 56 cells arranged as a 7×8 cell array. The individual cells in block B 202 each have a pattern density of 40%. Block A 202 and block B 204 are both adjacent to a block C 206. Block C 206 is a pattern density insensitive block containing 64 cells arranged as a 16×4 cell array. The individual cells in block C 206 each have a pattern density of 50%.

Returning to FIG. 1, in operation 104, a block is selected and a query performed to determine whether the block is pattern density sensitive or pattern density insensitive. If the block selected is pattern density sensitive, in operation 106, DCAP cells are added around the block, otherwise, the method 100 proceeds to operation 108. In operation 106, to minimize density change at an edge of a sensitive array, a row of DCAP cells are added to surround the sensitive array according to pattern density rules. In some embodiments the rules include a minimum pattern density, a maximum pattern density, a maximum pattern density change per unit distance and/or a predetermined specific pattern density between two adjacent blocks. In some embodiments, one or more successive rows of DCAP cells are added partially surrounding or surrounding the pattern density sensitive block. Pattern density in each row of DCAP cells is set according to pattern density rules. In some embodiments the pattern density increases in rows increasingly further from the pattern density sensitive block, but not more than a maximum pattern density change per unit distance, e.g., 5%, where the unit distance corresponds to the row of DCAP cells surrounding the pattern density sensitive block.

In some embodiments, maximum pattern density change per unit distance is limited to 5% overall, for example, a first surrounding row of DCAP cells is limited to being no more than 5% higher than the pattern density sensitive block the DCAP cells surround. A second surrounding row of DCAP cells is limited to being no more than 10% higher than the pattern density sensitive block the DCAP cells surround. A third surrounding row of DCAP cells is limited to being no more than 15% higher than the pattern density sensitive block the DCAP cells surround, and so forth until the maximum pattern density is reached or no further space is available. Pattern density of DCAP cells often increases with distance because increasing pattern density correlates with increasing beneficial decoupling capacitance in the DCAP cells.

Figure 2B:
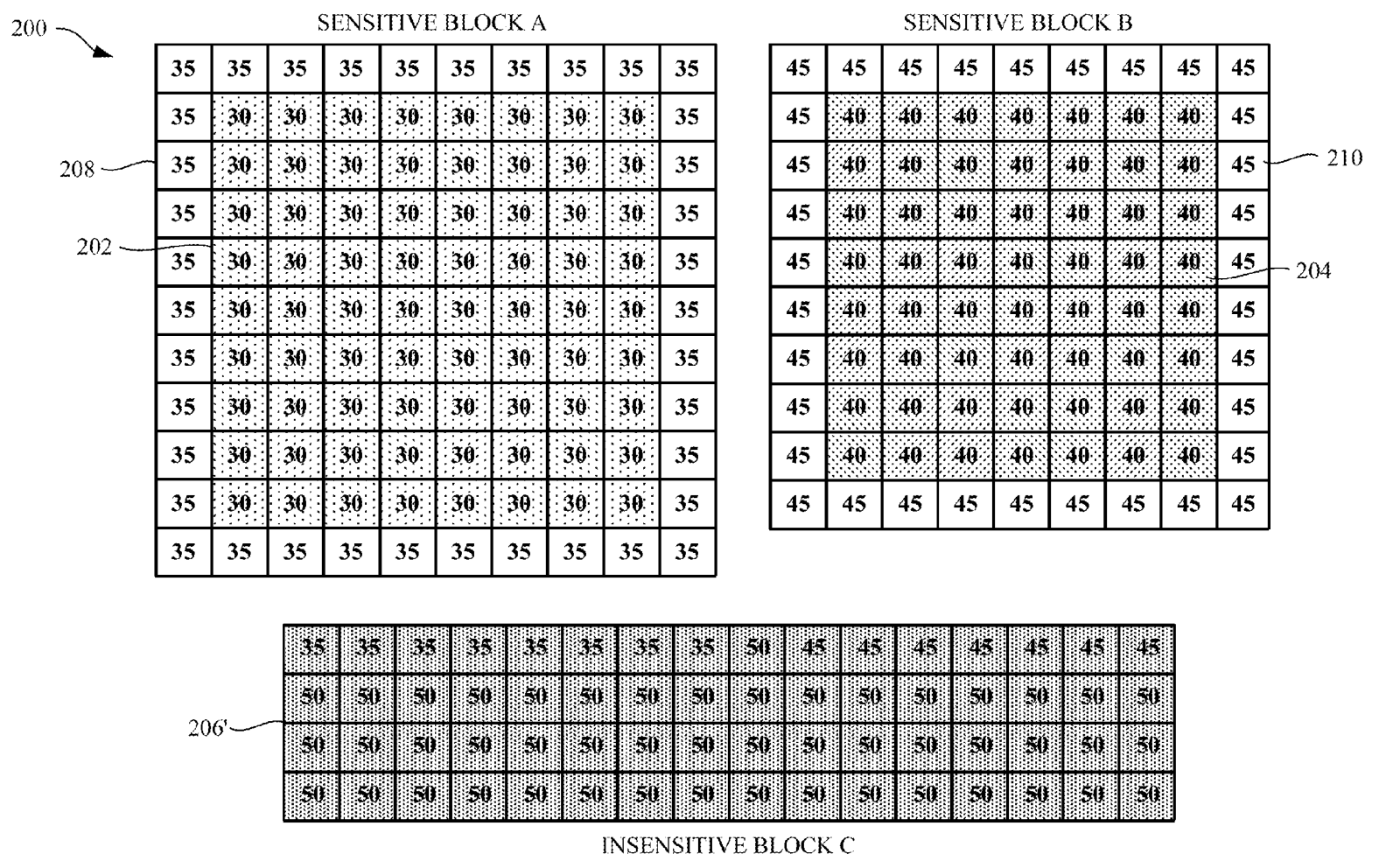

FIG. 2B is a diagram of blocks at one of different stages in a density-controlled floorplan design for integrated circuits 200, in accordance with some embodiments. Pattern density sensitive block A 202 is surrounded by a first row of DCAP cells 208 having a pattern density of 35%. A pattern density rule limits the first row of DCAP cells 208 to an overall pattern density 5% higher than the pattern density sensitive block A 202. Pattern density sensitive block B 204 is surrounded by a first row of DCAP cells 210 having a pattern density of 45%. A pattern density rule limits the first row of DCAP cells 210 to an overall pattern density 5% higher than the pattern density sensitive block A 204.

Returning to FIG. 1, in operation 108, a query is performed to determine whether the selected pattern density insensitive block is adjacent to a pattern density sensitive block. If the selected pattern density insensitive block is adjacent to a pattern density sensitive block, in operation 110, the pattern density of the pattern density insensitive block is changed to bring the pattern density insensitive block into contact with at least one side of the pattern density sensitive block or blocks, or otherwise as close as the pattern density rules permit. If the selected pattern density insensitive block is not adjacent to a pattern density sensitive block, the method 100 proceeds to operation 112.

FIG. 2B is a diagram of blocks at one of different stages in a density-controlled floorplan design for integrated circuits 200, in accordance with some embodiments. A pattern density of insensitive block C 206' is changed to form a row of eight (8) cells having a 35% pattern density, corresponding to pattern density of first row of DCAP cells 208 surrounding pattern density sensitive block A 202, and a row of seven (7) cells having a pattern density of 45% corresponding to pattern density of first row of DCAP cells 210 surrounding pattern density sensitive block B 204.

Returning to FIG. 1, in operation 112, adjacent blocks are merged. A row of DCAP cells between adjacent pattern density sensitive blocks is removed if pattern density rules are not violated. For example, in some embodiments, a row of DCAP cells between adjacent pattern density sensitive blocks is removed because a remaining row of DCAP cells between adjacent pattern density sensitive blocks does not exceed a maximum pattern density change per unit distance of 5% overall.

Figure 2C:
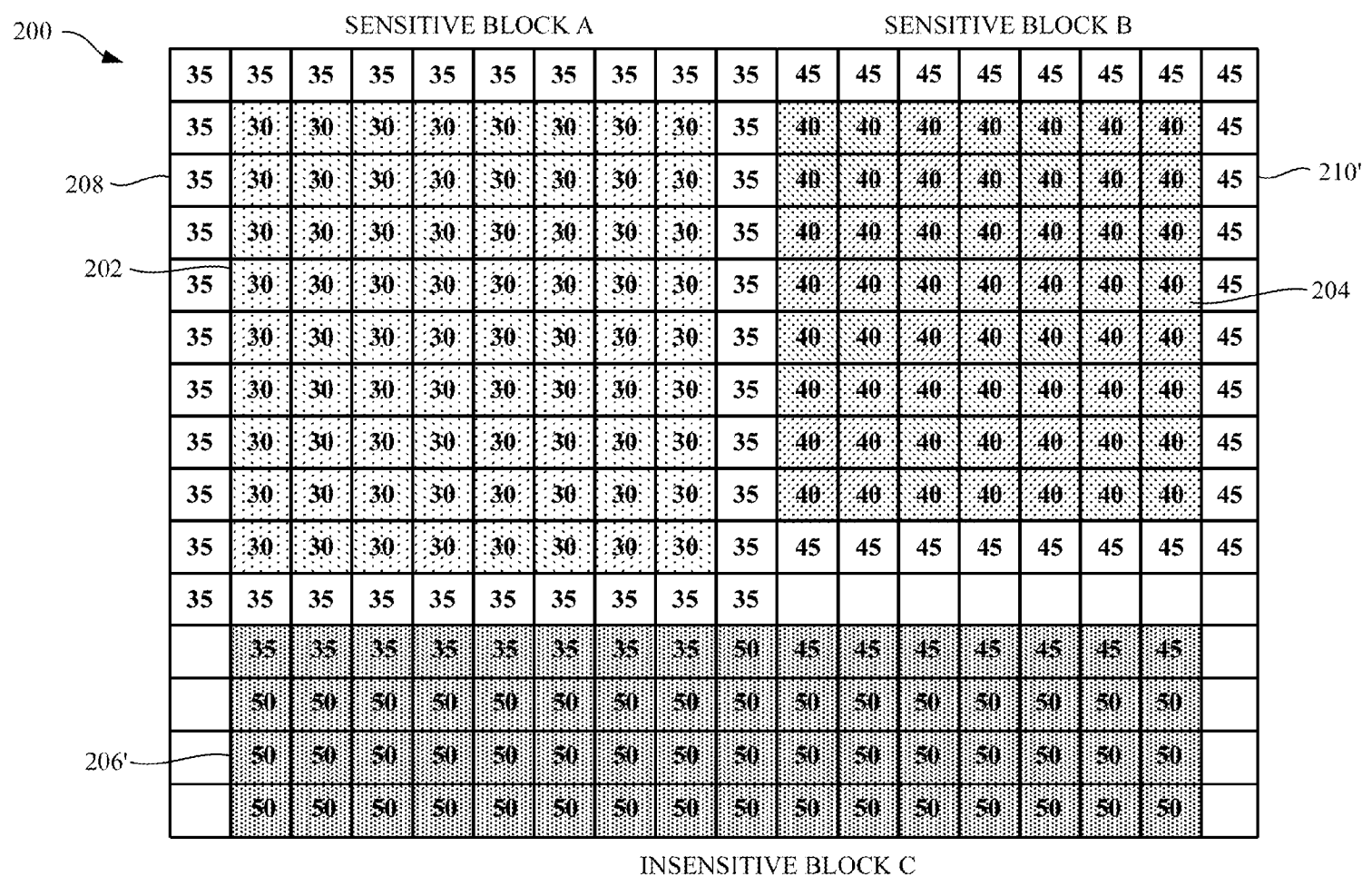

FIG. 2C is a diagram of blocks at one of different stages in a density-controlled floorplan design for integrated circuits 200, in accordance with some embodiments. Pattern density sensitive block A 202 remains surrounded by first row of DCAP cells 208, however, a leftmost part of first row of DCAP cells 210 is removed to form first row of DCAP cells 210' such that only first row of DCAP cells 208 is between block A 202 and block B 204. Pattern density insensitive block C 206' is positioned below and adjacent to block A 202 such that only first row of DCAP cells 208 is between block A 202 and block C 206'. Because block B 204 is positioned further away from block C 206' than block A 202 is, part of the first row of DCAP cells 210', and space for an additional row of cells, is between block B and block C.

Returning to FIG. 1, in operation 114, the pattern density of a pattern density insensitive block is revised by changing pattern density of some of the cells of the pattern density insensitive block and/or changing the shape of the pattern density insensitive block by repositioning cells of the pattern density insensitive block. In some embodiments, cells of the pattern density insensitive block are repositioned to fill gaps between blocks and/or take the place of some of the DCAP cells, thereby further improving efficiency of the floorplan. Cells of the pattern density insensitive block are subject to the pattern density rules. For example, cells repositioned closer to a pattern density sensitive block cannot exceed maximum pattern density change per unit distance and have pattern densities adjusted accordingly to comply with pattern density rules. Completion of operation 114 produces a density-controlled floorplan design for integrated circuits.

Figure 2D:
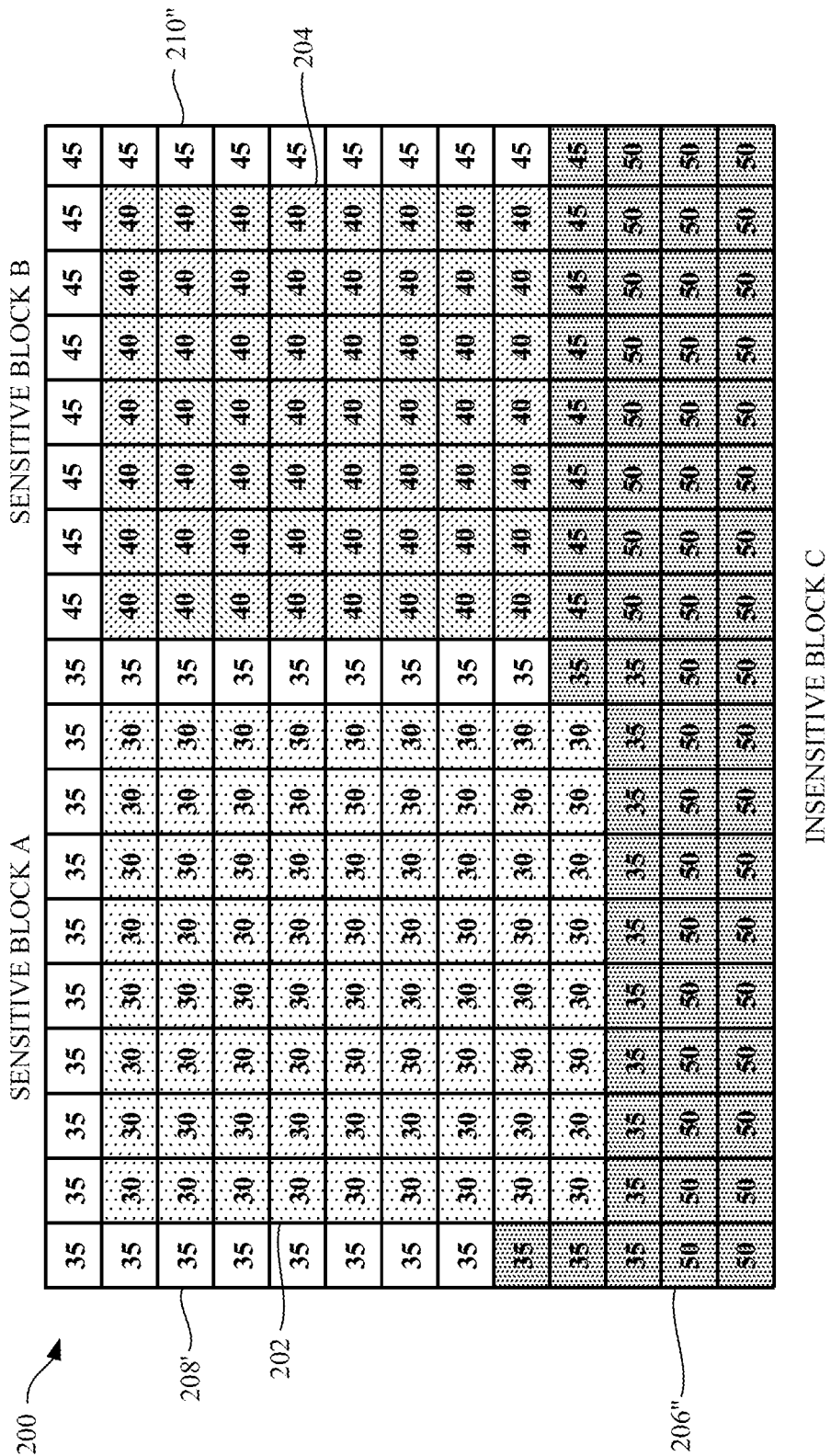

FIG. 2D is a diagram of blocks at one of different stages in a density-controlled floorplan design for integrated circuits 200, in accordance with some embodiments. Pattern density insensitive block C 206" includes cells repositioned with respect to block A 202 and block B 204, and cells having changed pattern density to produce pattern density insensitive block C 206". Cells in pattern density insensitive block C 206" are repositioned below and adjacent to block B 204 such that there are no spaces between block B and block C, and cells in first row of DCAP cells 210" between block B and block C are replaced with cells in pattern density insensitive block C. Similarly, cells in pattern density insensitive block C 206" are repositioned below and adjacent to block A 202 such that there are no spaces between block A and block C, and cells in first row of DCAP cells 208' between block A and block C are replaced with cells in pattern density insensitive block C. Some cells in pattern density insensitive block C 206" have changed pattern densities. One cell having a pattern density of 50% has its pattern density reduced to 45% and four cells having a pattern density of 50% have their pattern densities reduced to 35% in accordance with the maximum pattern density change per unit distance pattern density rule. In some other embodiments, one cell having a pattern density of 45% and four cells having a pattern density of 35% are added to the pattern density insensitive block C 206". FIG. 2D illustrates completion of a density-controlled floorplan design for integrated circuits. The density-controlled floorplan design for integrated circuits reduces chip area and improves IC performance, especially for pattern density sensitive blocks.

Figure 2E:
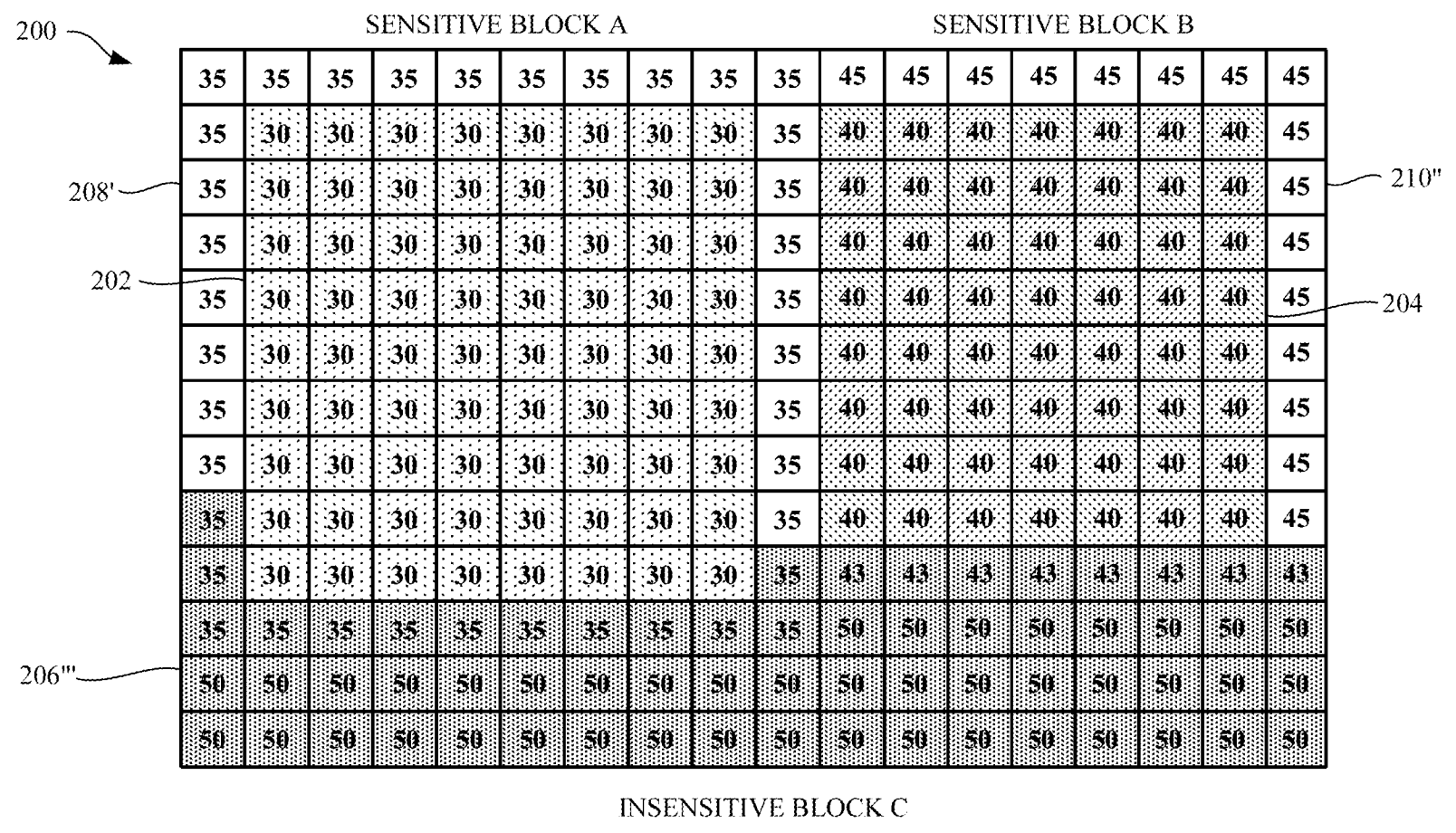

FIG. 2E is a diagram of blocks at one of different stages in a density-controlled floorplan design for integrated circuits 200, in accordance with some embodiments. FIG. 2E is analogous to FIG. 2D, however, FIG. 2E illustrates application of a different pattern density rule. More specifically, instead of a pattern density rule that specifies a maximum pattern density change per unit distance, in FIG. 2E, a pattern density rule specifies a specific pattern density of 43% between block B 204 and block 206'. The specific pattern density between block B 204 and block 206''' reduces the difference between block B 204 and block C 206''' even more than the pattern density rule that specifies a maximum pattern density change per unit distance, to better control pattern density.

Figure 3A:
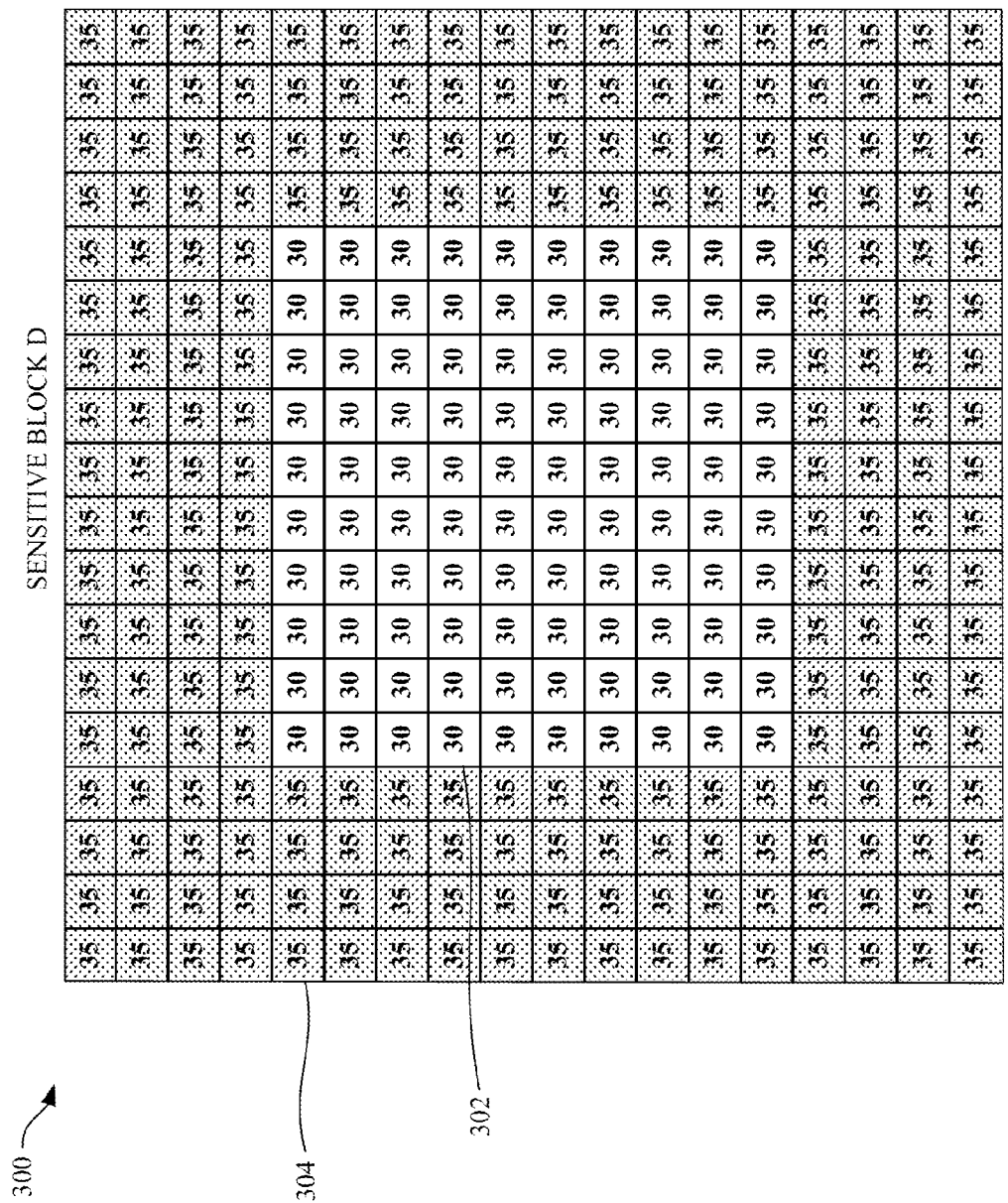
FIGS. 3A-3C are diagrams of a block with different pattern density rules in a density-controlled floorplan design for integrated circuits, in accordance with some embodiments.

FIG. 3A is a diagram of a block with at least one applied pattern density rule in a density-controlled floorplan design for integrated circuits 300, in accordance with some embodiments. A pattern density sensitive block D 302 is surrounded by four rows of DCAP cells 304. At least one pattern density rule specifies the pattern density of the four rows of DCAP cells 304. In some embodiments, the at least one pattern density rule specifies that each of the four rows of DCAP cells 304 have a specific pattern density, i.e., 35%. Pattern density is controlled and the four rows of DCAP cells 304 provide decoupling capacitance providing benefits such as mitigating the effects of electrical noise.

Figure 3B:
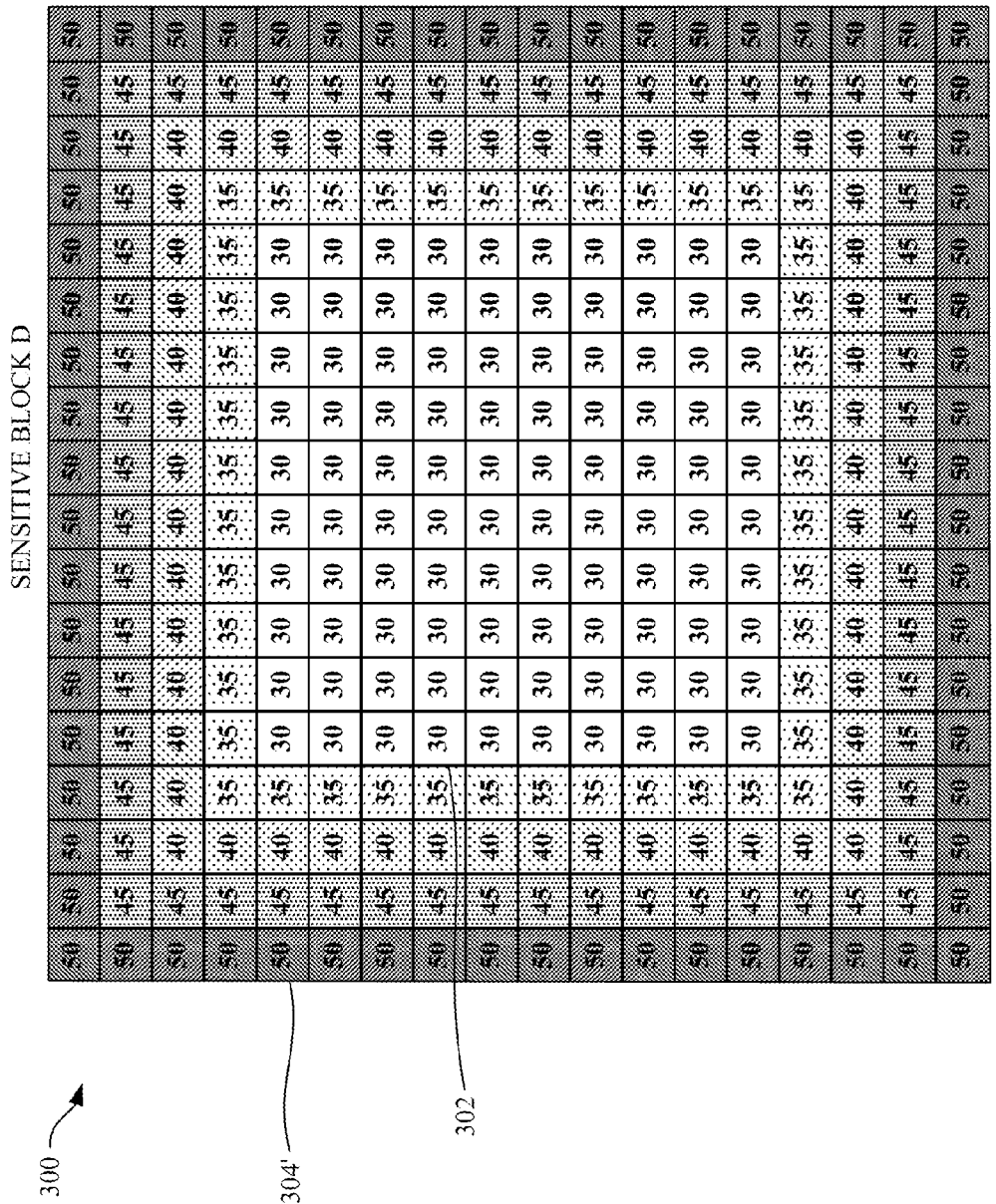

FIG. 3B is a diagram of a block with at least one applied pattern density rule in a density-controlled floorplan design for integrated circuits 300, in accordance with some embodiments. FIG. 3B is analogous to FIG. 3A in that pattern density sensitive block D 302 is surrounded by four rows of DCAP cells, however, in FIG. 3B, a different at least one pattern density rule specifies the pattern density of the four rows of DCAP cells 304'. In some embodiments, the at least one pattern density rule specifies that each successive row of the four rows of DCAP cells 304' has a maximum pattern density change per unit distance of 5% overall. In some embodiments, a maximum of 50% pattern density is specified. In some embodiments, the pattern density rule specifying a maximum pattern density change per unit distance of 5% overall is limited to a specified number of rows of DCAP cells. In some embodiments, the specified number of DCAP cells is four.

Figure 3C:
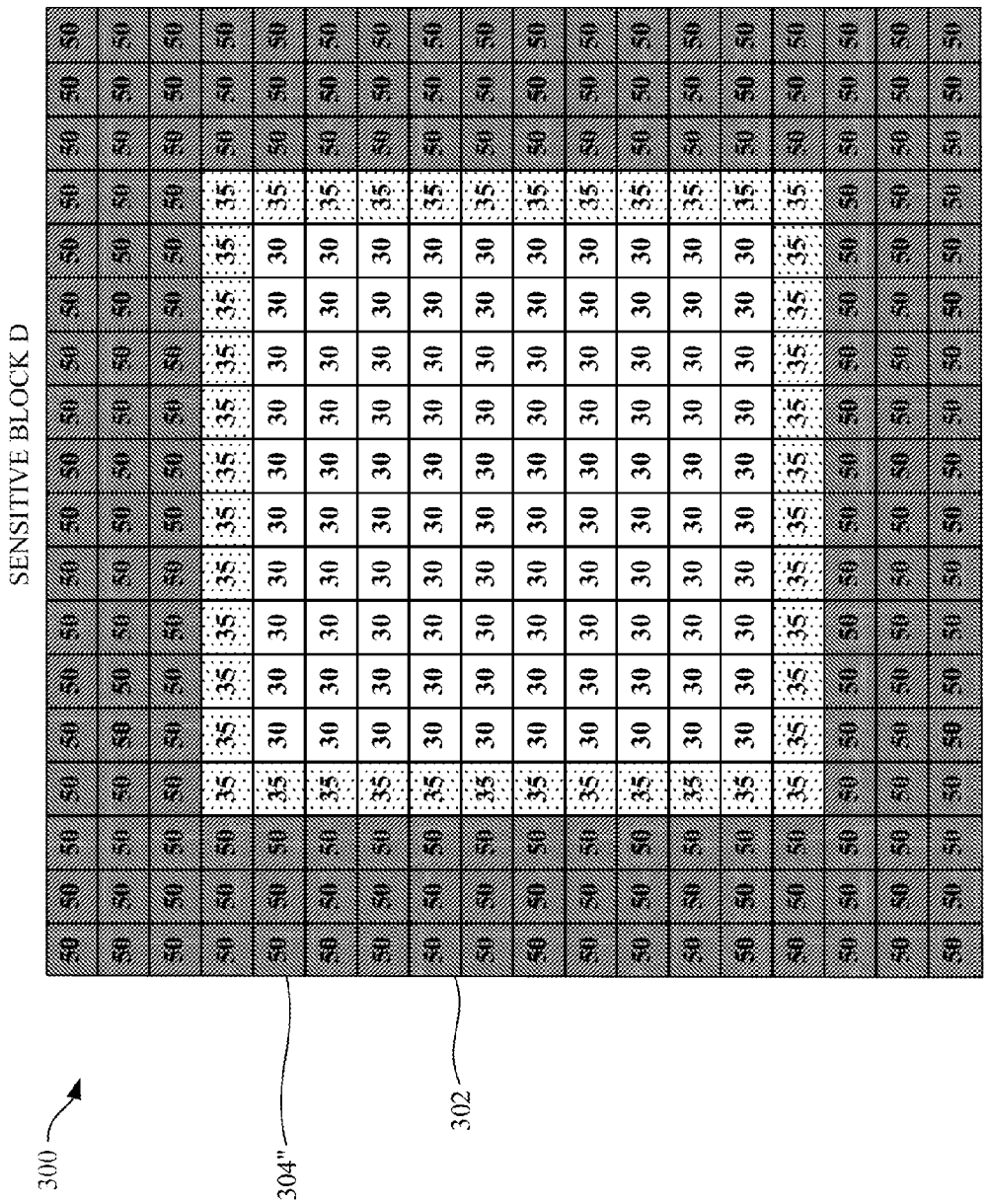

FIG. 3C is a diagram of a block with at least one applied pattern density rule in a density-controlled floorplan design for integrated circuits 300, in accordance with some embodiments. FIG. 3C is analogous to both FIG. 3A and FIG. 3B in that pattern density sensitive block D 302 is surrounded by four rows of DCAP cells, however, in FIG. 3C, a different at least one pattern density rule specifies the pattern density of the four rows of DCAP cells 304". In some embodiments, a first pattern density rule specifies that the first row of the four rows of DCAP cells 304" has a maximum pattern density change per unit distance of 5% overall. In some embodiments, the first row of the four rows of DCAP cells 304" has a pattern density of 35%. A second pattern density rule specifies that each of the four rows of DCAP cells 304", other than the first row, is set to a specified pattern density. In some embodiments, the second pattern density rule specifies that each of the four rows of DCAP cells 304", other than the first row, is set to a specified density of 50%.

FIGS. 4A and 4B are diagrams of blocks with different pattern density rules at different stages in a density-controlled floorplan design for integrated circuits, in accordance with some embodiments. In FIG. 4A, pattern density sensitive block D 402 is adjacent to pattern density insensitive block E 404, i.e., no other block is between block D and block E. In some embodiments, pattern density sensitive block D 402 is comprised of cells having a pattern density of 30% and pattern density insensitive block E 404 is comprised of cells having a pattern density of 40%. In FIG. 4B, pattern density sensitive block D 402 is repositioned to be in contact with pattern density insensitive block E 404' and pattern density in some of the cells of insensitive block E 404' is changed from insensitive block E 404 in FIG. 4A. As used herein, "contact" means cells are nearby each other without gaps large enough for additional cells. As illustrated in FIG. 4B, at least one pattern density rule is applied to the cells in pattern density insensitive block E 404' that are in direct contact with block D 402 have a pattern density. In some embodiments, the at least one pattern density rule specifies that a maximum pattern density change per unit distance of 5% overall. In some embodiments, the cells in pattern density insensitive block E 404' that are in direct contact with block D 402 have a pattern density of 35%. The pattern density rule reduces the change per unit distance between adjacent sensitive and insensitive blocks to better control pattern density.

Figures 4C, 4D:
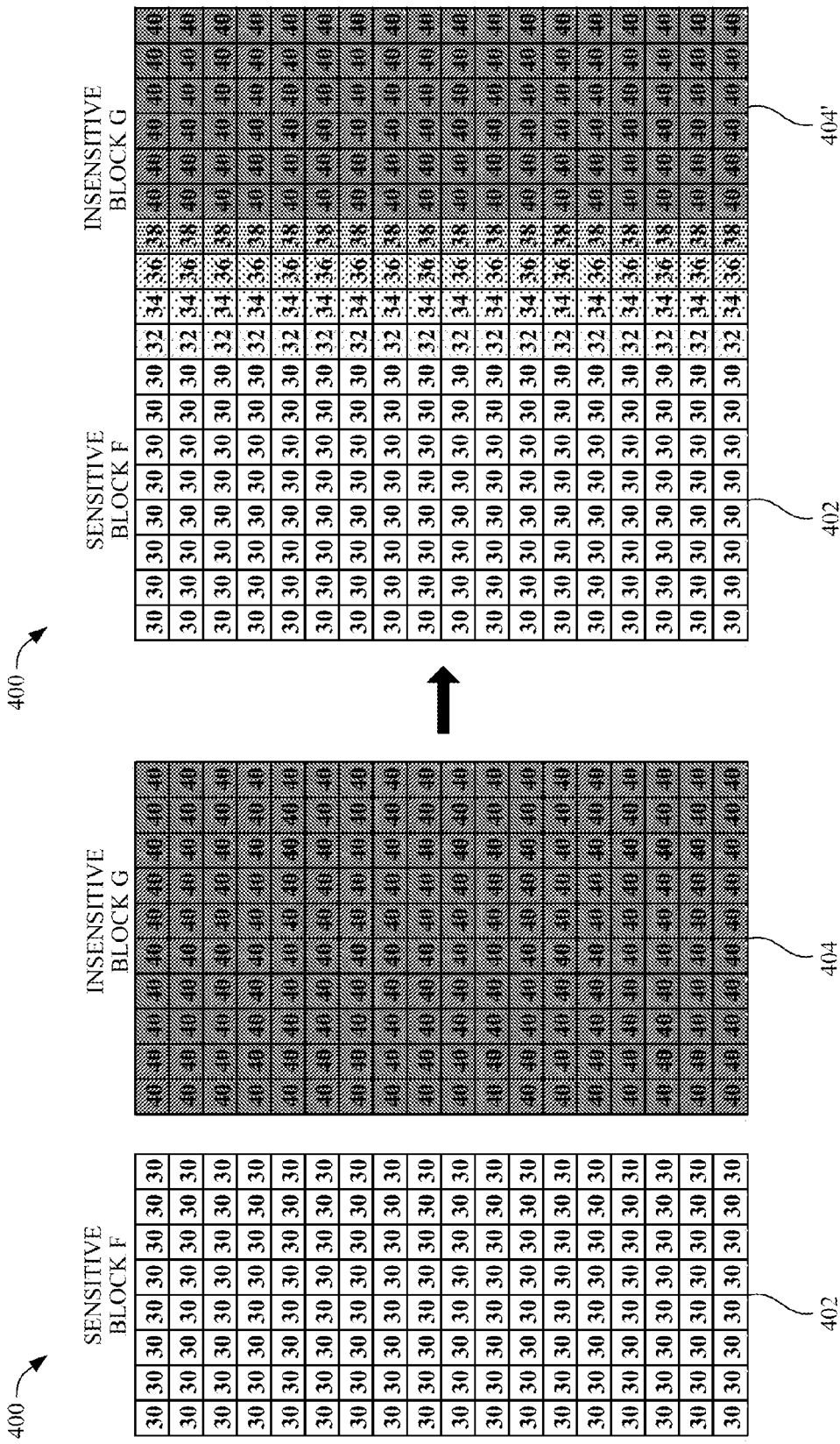

FIGS. 4C and 4D are diagrams of blocks with different pattern density rules at different stages in a density-controlled floorplan design for integrated circuits, in accordance with some embodiments. In FIG. 4C, pattern density sensitive block D 402 is adjacent to pattern density insensitive block E 404, i.e., no other block is between block D and block E. In some embodiments, pattern density sensitive block D 402 is comprised of cells having a pattern density of 30% and pattern density insensitive block E 404 is comprised of cells having a pattern density of 40%. In FIG. 4D, pattern density sensitive block D 402 is repositioned to be in contact with pattern density insensitive block E 404' and pattern density in some of the cells of insensitive block E 404' is changed from insensitive block E 404 in FIG. 4C. As illustrated in FIG. 4D, at least one pattern density rule is applied to the cells in pattern density insensitive block E 404' that are in direct contact with block D 402. In some embodiments, the at least one pattern density rule specifies maximum pattern density change per unit distance. In some embodiments, the at least one pattern density rule specifies that a maximum pattern density change per unit distance of 2% overall. In some other embodiments, the maximum pattern density change per unit distance is specified for a maximum unit distance, such as 5 cells. In some embodiments, the cells in pattern density insensitive block E 404' that are in direct contact with block D 402 have a pattern density of 32%, followed by rows of cells having pattern densities of 34%, 36%, 38% and 40%, respectively. The pattern density rule reduces the change per unit distance between adjacent sensitive and insensitive blocks to better control pattern density.

Figure 5:
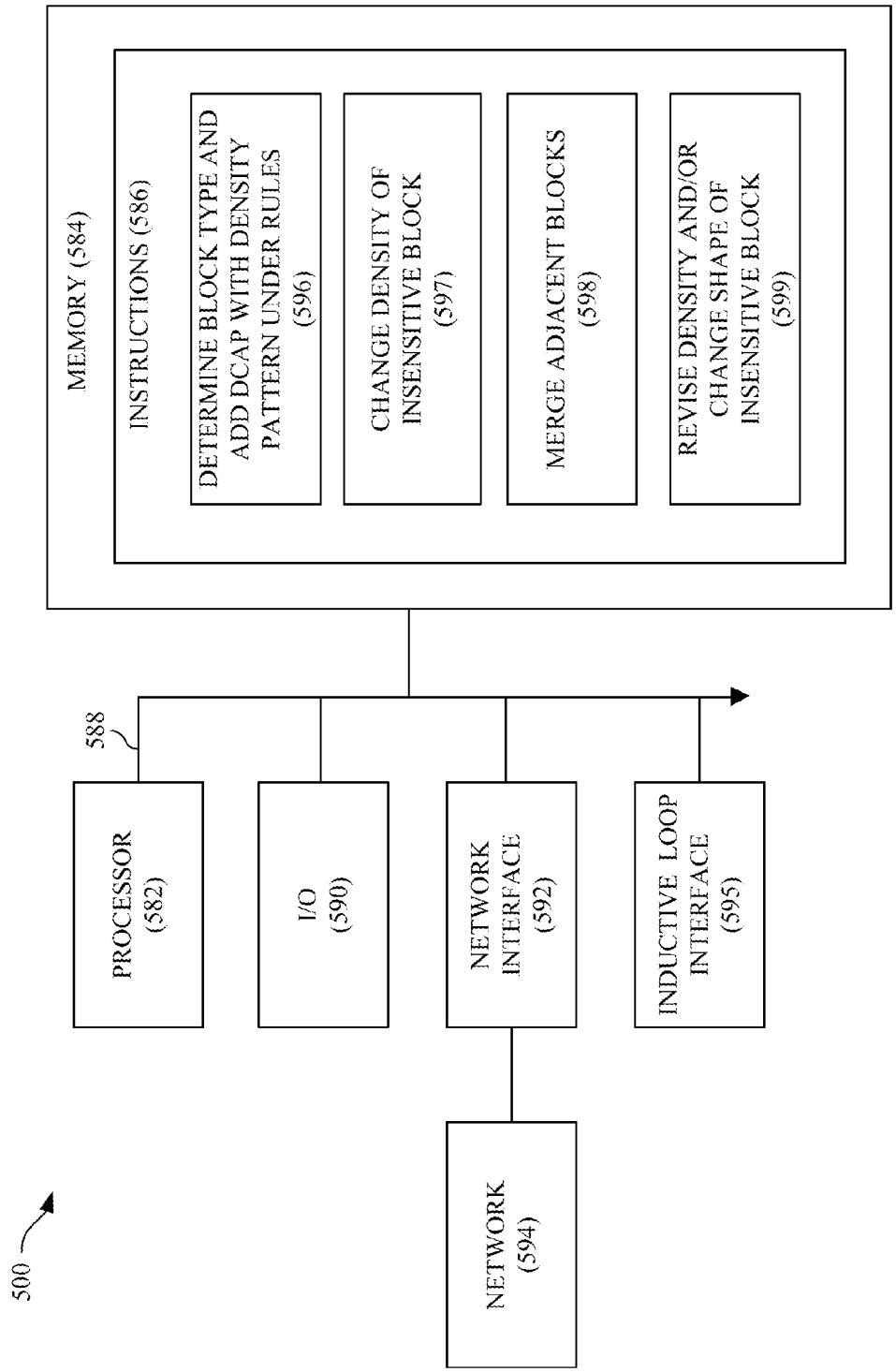
FIG. 5 is a block diagram of a computer system portion of a density-controlled floorplan design for integrated circuits system, in accordance with some embodiments.

FIG. 5 is a block diagram of a computer system 500 portion of a density-controlled floorplan design for integrated circuits, in accordance with some embodiments. In some embodiments, the computer system 500 executes a set of instructions to perform the method of density-controlled floorplan design for integrated circuits 100, 200, 300, 400 (FIGS. 1-4D). Computer system 500 includes a hardware processor 582 and a non-transitory, computer readable storage medium 584 encoded with, i.e., storing, the computer program code 586, i.e., a set of executable instructions. The processor 582 is electrically coupled to the computer readable storage medium 584 via a bus 588. The processor 582 is also electrically coupled to an I/O interface 590 by bus 588. A network interface 592 is also electrically connected to the processor 582 via bus 588. Network interface 592 is connected to a network 594, so that processor 582 and computer readable storage medium 584 are capable of connecting and communicating to external elements via network 594. The processor 582 is configured to execute the computer program code 586 encoded in the computer readable storage medium 584 in order to cause computer system 500 to be usable for performing a portion or all of the operations as described with respect to the method of density-controlled floorplan design for integrated circuits 100, 200, 300, 400 (FIGS. 1-4D).

In some embodiments, the computer program code 586 includes an instruction 596 wherein a block is determined to be pattern density sensitive and at least one row of DCAP is added to surround a pattern density sensitive block. A change pattern density of insensitive block instruction 597 changes the pattern density of an insensitive block in accordance with pattern density rules. A merge adjacent blocks instruction 598 merges adjacent pattern density sensitive and insensitive blocks. A revise density and/or change shape of an insensitive block instruction 599 revises the pattern density of the pattern density insensitive block according to at least one pattern density rule and/or moves cells in the pattern density insensitive block into contact with the pattern density sensitive block.

In some embodiments, the processor 582 is a central processing unit (CPU), a multi-processor, a distributed processing system, an application specific integrated circuit (ASIC), and/or a suitable processing unit.

In some embodiments, the computer readable storage medium 584 is an electronic, magnetic, optical, electromagnetic, infrared, and/or a semiconductor system (or apparatus or device). For example, the computer readable storage medium 584 includes a semiconductor or solid-state memory, a magnetic tape, a removable computer diskette, a random access memory (RAM), a read-only memory (ROM), a rigid magnetic disk, and/or an optical disk. In some embodiments, using optical disks, the computer readable storage medium 584 includes a compact disk-read only memory (CD-ROM), a compact disk-read/write (CD-R/W), a digital video disc (DVD) and/or Blu-Ray Disk.

In some embodiments, the storage medium 584 stores the computer program code 586 configured to cause computer system 500 to perform the operations as described with respect to the method of density-controlled floorplan design for integrated circuits 100, 200, 300, 400 (FIGS. 1-4D).

In some embodiments, the storage medium 584 stores instructions 586 for interfacing with external components. The instructions 586 enable processor 582 to generate operating instructions readable by a system for performing the method of density-controlled floorplan design for integrated circuits 100, 200, 300, 400 (FIGS. 1-4D).

Computer system 500 includes I/O interface 590. I/O interface 590 is coupled to external circuitry. In some embodiments, I/O interface 590 includes a keyboard, keypad, mouse, trackball, trackpad, and/or cursor direction keys for communicating information and commands to processor 582.

Computer system 500 also includes network interface 592 coupled to the processor 582. Network interface 592 allows computer system 500 to communicate with network 594, to which one or more other computer systems are connected. Network interface 592 includes wireless network interfaces such as BLUETOOTH, WIFI, WIMAX, GPRS, or WCDMA; or wired network interface such as ETHERNET, USB, or IEEE-1394.

Computer system 500 also includes inductive loop interface 595 coupled to the processor 582. Inductive loop interface 595 allows computer system 500 to communicate with external devices, to which one or more other computer systems are connected. In some embodiments, the operations as described above are implemented in two or more computer systems 590.

Computer system 500 is configured to receive information related to the instructions 586 through I/O interface 590. The information is transferred to processor 582 via bus 588 to determine corresponding adjustments to the transportation operation. The instructions are then stored in computer readable medium 584 as instructions 586.

Some embodiments include a method of density-controlled floorplan design for integrated circuits having a plurality of blocks that includes positioning decoupling capacitor (DCAP) cells at least partially around a pattern density sensitive block. The method also includes changing at least a portion of a pattern density insensitive block adjacent to the pattern density sensitive block according to at least one pattern density rule.

Some embodiments include a method of density-controlled floorplan design for integrated circuits having a plurality of blocks that includes positioning decoupling capacitor (DCAP) cells at least partially around a pattern density sensitive block. The method further includes specifying a pattern density of the DCAP cells according to a first pattern density rule. The method still further includes changing at least a portion of a pattern density insensitive block adjacent to the pattern density sensitive block according to a second pattern density rule.

Some embodiments include a system including a computer-readable storage medium containing data representing an integrated circuit (IC) design, and instructions for causing, if executed by a processor, the processor to perform a method of density-controlled floorplan design for integrated circuits having a plurality of blocks. The system further includes a processor coupled to read the storage medium, the processor configured to execute the instructions to cause positioning first DCAP cells at least partially around a first pattern density sensitive block and specifying a pattern density of the first DCAP cells according to a first pattern density rule and positioning second DCAP cells at least partially around a second pattern density sensitive block adjacent to the first pattern density sensitive block and specifying a pattern density of the second DCAP cells according to a second pattern density rule. The system still further includes the processor configured to execute the instructions to cause changing the pattern density of at least a portion of a pattern density insensitive block adjacent to the first pattern density sensitive block or the second pattern density sensitive block according to one of the first pattern density rule or the second pattern density rule.

Some embodiments include an integrated circuit that includes pattern density sensitive block at least partially surrounded by decoupling capacitor (DCAP) cells as specified by a first pattern density rule and a pattern density insensitive block having a pattern density, a position or a pattern density and position of a portion of the pattern density insensitive block specified by a second pattern density rule.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of density-controlled floorplan design for integrated circuits having a plurality of blocks, comprising:
    positioning decoupling capacitor (DCAP) cells at least partially around a pattern density sensitive block; and
    changing at least a portion of a pattern density insensitive block adjacent to the pattern density sensitive block according to at least one pattern density rule, wherein less than an entirety of the pattern density insensitive block is changed, and the pattern density insensitivity block is different from the DCAP cells.

2. The method of claim 1 wherein the portion of the pattern density insensitive block is repositioned closer to the pattern density sensitive block.

3. The method of claim 1 wherein a pattern density of the portion of the pattern density insensitive block is changed.

4. The method of claim 1 wherein the portion of the pattern density insensitive block is repositioned closer to the pattern density sensitive block and pattern density of the portion of the pattern density insensitive block is changed.

5. The method of claim 1 wherein the at least one pattern density rule specifies one of a minimum, a maximum or predetermined pattern density between the pattern density sensitive block and the pattern density insensitive block.

6. The method of claim 1 wherein the at least one pattern density rule specifies a maximum pattern density change per unit distance.

7. The method of claim 5 wherein the at least one pattern density rule specifies a maximum pattern density change per unit distance.

8. A system having a processor configured to execute instructions to perform a method of density-controlled floorplan design for integrated circuits having a plurality of blocks, comprising:
    positioning decoupling capacitor (DCAP) cells at least partially around a pattern density sensitive block;
    specifying a pattern density of the DCAP cells according to a first pattern density rule;
    changing at least a portion of a pattern density insensitive block adjacent to the pattern density sensitive block according to a second pattern density rule, wherein the DCAP cells are different from the pattern density insensitive block.

9. The method of claim 8 wherein the first pattern density rule specifies a maximum pattern density.

10. The method of claim 8 wherein the second pattern density rule specifies a maximum pattern density.

11. The method of claim 8 wherein the first pattern density rule specifies a predetermined pattern density.

12. The method of claim 8 wherein the second pattern density rule specifies a predetermined pattern density.

13. The method of claim 8 wherein the first pattern density rule specifies a maximum pattern density change per unit distance.

14. The method of claim 8 wherein the second pattern density rule specifies a maximum pattern density change per unit distance.

15. A system, comprising:
    a computer-readable storage medium containing data representing an integrated circuit (IC) design, and instructions for causing, if executed by a processor, the processor to perform a method of density-controlled floorplan design for integrated circuits having a plurality of blocks; and
    a processor coupled to read the storage medium, the processor configured to execute the instructions to cause:
    positioning first DCAP cells at least partially around a first pattern density sensitive block and specifying a pattern density of the first DCAP cells according to a first pattern density rule, wherein the first pattern density rule specifies a maximum pattern density change per unit distance;
    positioning second DCAP cells at least partially around a second pattern density sensitive block adjacent to the first pattern density sensitive block and specifying a pattern density of the second DCAP cells according to a second pattern density rule; and
    changing the pattern density of at least a portion of a pattern density insensitive block adjacent to the first pattern density sensitive block or the second pattern density sensitive block according to one of the first pattern density rule or the second pattern density rule, wherein at least one of the first DCAP cells or the second DCAP cells is different from the pattern density insensitive block.

16. The system of claim 15 wherein the portion of the pattern density insensitive block is closer to one of the first pattern density sensitive block or the second pattern density sensitive block than a remaining unchanged portion of the pattern density insensitive block.

17. The system of claim 15 wherein the pattern density insensitive block is positioned in contact with one of the first pattern density sensitive block or the second pattern density sensitive block.

18. The system of claim 15 wherein the first pattern density rule is the same as the second pattern density rule.

19. The system of claim 15 wherein the first pattern density rule is different from the second pattern density rule.

20. The system of claim 15 wherein the second pattern density rule specifies a maximum pattern density change per unit distance.

21. An integrated circuit, comprising:
- a pattern density sensitive block at least partially surrounded by decoupling capacitor (DCAP) cells as specified by a first pattern density rule;
- a pattern density insensitive block having a pattern density, a position or a pattern density and position of a portion of the pattern density insensitive block specified by a second pattern density rule different from the first pattern density rule, wherein the DCAP cells are between the pattern density insensitive block and the pattern density sensitive block.

\* \* \* \* \*